United States Patent
Yoshitake et al.

(10) Patent No.: US 9,105,397 B2
(45) Date of Patent: Aug. 11, 2015

(54) CAPACITOR EMBEDDED BETWEEN BUSBARS, ELECTRIC POWER DEVICE AND ELECTRIC POWER CONVERSION DEVICE

(75) Inventors: Yuichiro Yoshitake, Abiko (JP); Shuji Katoh, Hitachiota (JP); Hiroshi Morita, Mito (JP); Atsushi Ootake, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 117 days.

(21) Appl. No.: 13/880,895

(22) PCT Filed: Oct. 11, 2011

(86) PCT No.: PCT/JP2011/073307
§ 371 (c)(1),
(2), (4) Date: Jul. 1, 2013

(87) PCT Pub. No.: WO2012/056873
PCT Pub. Date: May 3, 2012

(65) Prior Publication Data
US 2013/0279227 A1    Oct. 24, 2013

(30) Foreign Application Priority Data
Oct. 28, 2010  (JP) ................. 2010-242583

(51) Int. Cl.
H02M 7/537    (2006.01)
H01G 4/002    (2006.01)
H02M 7/00     (2006.01)
H01G 7/06     (2006.01)
H01G 4/33     (2006.01)
H01G 4/40     (2006.01)

(52) U.S. Cl.
CPC ............ *H01G 4/002* (2013.01); *H01G 7/06* (2013.01); *H02M 7/003* (2013.01); *H01G 4/33* (2013.01); *H01G 4/40* (2013.01)

(58) Field of Classification Search
CPC ........ H02M 7/003; H02M 7/537; H02M 7/538
USPC ................................... 363/131, 132
See application file for complete search history.

(56) References Cited

U.S. PATENT DOCUMENTS

| | | | |
|---|---|---|---|
| 8,112,853 B2 * | 2/2012 | Yoshinaga et al. | 29/25.42 |
| 8,228,660 B2 * | 7/2012 | Fujii et al. | 361/274.1 |
| 2007/0241379 A1 * | 10/2007 | Sakashita et al. | 257/295 |

FOREIGN PATENT DOCUMENTS

| | | |
|---|---|---|
| JP | 08-055752 A | 2/1996 |
| JP | 10-098887 A | 4/1998 |
| JP | 2003-319665 A | 11/2003 |
| JP | 2008-295227 A | 12/2008 |

OTHER PUBLICATIONS

Korean Office Action, Korean Patent Appln. No. 10-2013-7010596, Apr. 17, 2014, 3 pp.

* cited by examiner

*Primary Examiner* — Adolf Berhane
*Assistant Examiner* — Yemane Mehari
(74) *Attorney, Agent, or Firm* — Volpe and Koenig, P.C.

(57) ABSTRACT

The present invention provides an inter-bus-bar built-in capacitor capable of reducing the size of a capacitor used in an inverter or the like or downsizing the capacitor, and provides power equipment as well as a power converting apparatus. The inter-bus-bar built-in capacitor is provided between a pair of opposing bus bars and includes a high-dielectric-constant material which has a relative dielectric constant of at least 50 when a voltage of 1,000 V is applied at a temperature of 25° C. Thus, it is possible to provide the inter-bus-bar built-in capacitor capable of reducing the size of a capacitor used in an inverter or the like or downsizing the capacitor and provide the power equipment as well as the power converting apparatus.

9 Claims, 5 Drawing Sheets

CAPACITOR EMBEDDED BETWEEN BUSBARS, ELECTRIC POWER DEVICE AND ELECTRIC POWER CONVERSION DEVICE

TECHNICAL FIELD

The present invention relates to an inter-bus-bar built-in capacitor, power equipment and a power converting apparatus.

BACKGROUND ART

A capacitor capable of readily supplying electrical energy to an electrical circuit is used in various kinds of power equipment including an inverter (such as a high-voltage inverter), an electric current breaker, a transformer and a high-voltage power source. In addition, in accordance with, among others, differences in internal structure between the capacitors, the voltage ranks of the capacitors, the applications of the capacitors and the types of the power equipment making use of the capacitors, the specifications of the capacitors are completely different from each other.

In a high-voltage inverter for example, normally, inside the inverter (inverter board) or inside an inverter unit composing the inverter, in accordance with the voltage rank, a smoothing capacitor such as an aluminum electrolytic capacitor or a film capacitor is provided. In addition, a snubber capacitor is provided in some cases.

In general, an inverter such as a high-voltage inverter has an insulated gate bipolar transistor (properly referred to hereafter as an IGBT) and a smoothing capacitor electrically connected to the IGBT through a bus bar. In particular, if the inverter is a high-voltage inverter, the smoothing capacitor has a large size so that the capacitor occupies a large space in the inverter. In addition, in order to avoid an insulation failure, it is necessary to provide a spatial distance which is long to a certain degree between bus bars, which are normally provided between the smoothing capacitor and the IGBT, or between a bus bar and a ground frame (that is, a housing composing the inverter).

On top of that, in order to suppress a surge (that is, in order to decrease a suddenly rising voltage), a snubber capacitor is usually provided at a location in close proximity to the IGBT. Since the price of the snubber capacitor is high, however, it is desirable to make the snubber capacitor cheaper (that is, it is desirable to decrease the capacity of the snubber capacitor). In order to solve this problem, there is provided a capacitor described in Patent Document 1 to serve as a capacitor composing a snubber circuit. This capacitor is provided so that a piece of planar resin having a high dielectric constant is in close contact with an area opposite to bus bar.

PRIOR ART DOCUMENT

Patent Document

Patent Document 1: JP-A-2008-295227

SUMMARY OF THE INVENTION

Problems to be Solved by the Invention

A capacitor described in Patent Document 1 composes a snubber circuit as explained above to serve as a capacitor for relatively low voltages (specifically, not higher than about 200 V). Thus, a gap between bus bars composing the capacitor is small. In addition, a piece of resin is provided between the bus bars. The dielectric constant remains low as before. Thus, even though it is possible to reduce the number of small size capacitors each having a small capacity and a low voltage and/or downsize the capacitor to serve as a snubber capacitor or the like in accordance with a technology described in Patent Document 1, the electrical capacity of the capacitor provided between bus bars remains low as before. That is to say, the technology described in Patent Document 1 is not sufficient for reducing the number of smoothing-capacitors and/or downsizing the smoothing capacitor which is a typical large size capacitor having a large capacity and a high voltage.

It is therefore an object of the present invention addressing the problems described above to provide an inter-bus-bar built-in capacitor to serve as a capacitor usable for reducing the number of large-size capacitors used typically in a high-voltage inverter or downsizing the large-size capacitor, provide power equipment and provide a power converting apparatus.

Means for Solving the Problems

As a result of intensive studies of the problems to be solved as described above, inventors of the present invention have discovered that, by providing a high-dielectric-constant material having a specially high dielectric constant between bus bars, it is possible to provide an inter-bus-bar built-in capacitor, power equipment and a power converting apparatus.

Effect of the Invention

In accordance with the present invention, it is possible to provide an inter-bus-bar built-in capacitor to serve as a capacitor usable for reducing the number of large-size capacitors used typically in a high-voltage inverter or downsizing the large-size capacitor, provide power equipment and provide a power converting apparatus.

Other objects of the present invention, characteristics thereof and its merits perhaps become apparent from the following description of an embodiment of the present invention with reference to accompanying diagrams.

MODE FOR CARRYING OUT THE INVENTION

By referring to diagrams, the following description explains details of a concrete example of an inter-bus-bar built-in capacitor in accordance with a mode (referred to hereafter as an embodiment) for carrying out the present invention. However, embodiments of the present invention are by no means limited to this embodiment described below. That is to say, the embodiment can be further changed arbitrarily in a variety of ways within a range not deviating from essentials of the present invention.

1. Inter-Bus-Bar Built-In Capacitor

Figure 1:
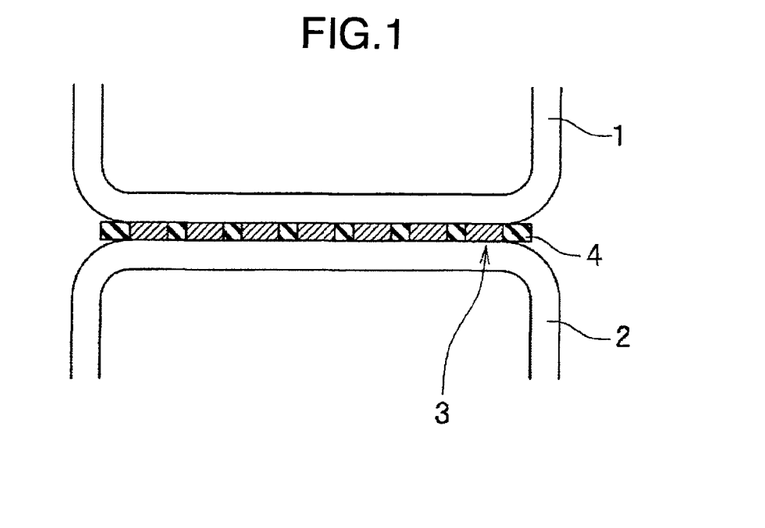
FIG. 1 is a diagram depicting a model of bus bars for an inter-bus-bar built-in capacitor in accordance with a first embodiment of the present invention.

FIG. 1 is a diagram depicting a model of bus bars for a capacitor built in between the bus bars in accordance with a first embodiment of the present invention. As shown in FIG. 1, the inter-bus-bar built-in capacitor 3 according to the first embodiment is provided between a pair of opposing bus bars, that is, an upper bus bar 1 and a lower bus bar 2. In addition, the inter-bus-bar built-in capacitor 3 according to the first embodiment includes a high-dielectric-constant material which has a relative dielectric constant of at least 50 when a voltage of 1,000 V is applied to the material at a temperature of 25° C. In the first embodiment shown in FIG. 1, a plurality of inter-bus-bar built-in capacitors 3 are provided between the pair of opposing bus bars, that is, the upper bus bar 1 and the lower bus bar 2. In addition, an insulation body 4 is provided between the inter-bus-bar built-in capacitors 3.

High-Dielectric-Constant Material

As described above, the inter-bus-bar built-in capacitor 3 according to the first embodiment includes a high-dielectric-constant material which has a relative dielectric constant of at least 50 when a voltage of 1,000 V is applied to the material at a temperature of 25° C. However, a desirable value of the relative dielectric constant is a value not smaller than 500 and an even more desirable value of the relative dielectric constant is a value not smaller than 2,000. If the value of the relative dielectric constant is too small, the inter-bus-bar built-in capacitor including the dielectric material is not capable of withstanding a high voltage so that it is quite within the bounds of possibility that an insulation failure occurs. In addition, it is also quite within the bounds of possibility that the number of smoothing capacitors, which are each normally a large-size capacitor having a large capacity, can no longer be made smaller and/or the capacitors cannot be downsized anymore.

Concrete examples of the high-dielectric-constant material are barium titanate ($BaTiO_3$), zinc oxide supplementation silicon carbide (ZnO supplementation SiC) and strontium titanate ($SrTiO_3$). That is to say, it is desirable that the inter-bus-bar built-in capacitor 3 according to the first embodiment has the same material as the so-called ceramics capacitor. It is even more desirable that the high-dielectric-constant material is the barium titanate or the zinc oxide supplementation silicon carbide. It is to be noted that the high-dielectric-constant material is any one selected from the concrete examples as a material used alone or any ones selected from the concrete examples as two or more materials combined at an arbitrary combination ratio.

Electrodes

The inter-bus-bar built-in capacitor 3 according to the first embodiment normally has electrodes besides the high-dielectric-constant material. The concrete structure of the electrodes is not prescribed in particular. Usually, however, the inter-bus-bar built-in capacitor 3 according to the first embodiment has an upper electrode brought into contact with the upper bus bar 1 and a lower electrode brought into contact with the lower bus bar 2. In addition, the high-dielectric-constant material is held between the upper and lower electrodes. The distance between the upper and lower electrodes is not prescribed in particular. If the distance between the upper and lower electrodes is too short, however, the upper and lower electrodes are shorted to each other in some cases. If the distance between the upper and lower electrodes is excessively too long, on the other hand, it is quite within the bounds of possibility that the electric capacitance of the inter-bus-bar built-in capacitor decreases. Thus, the distance is normally set at a value not smaller than 0.02 mm. It is preferable as well as desirable to set the distance at a value not smaller than 0.05 mm but not greater than 0.5 mm. Thus, it is especially important to have a long distance between the electrodes in order to avoid an insulation failure because, for example, a voltage applied to a high-voltage inverter or the like is high. If the distance between the electrodes is long, the electric capacitance of the inter-bus-bar built-in capacitor decreases. In accordance with the inter-bus-bar built-in capacitor 3 provided by the first embodiment, however, the electrical capacitance of the inter-bus-bar built-in capacitor 3 can be sustained at a sufficiently large value even if the distance between the electrodes is long.

Figure 2:
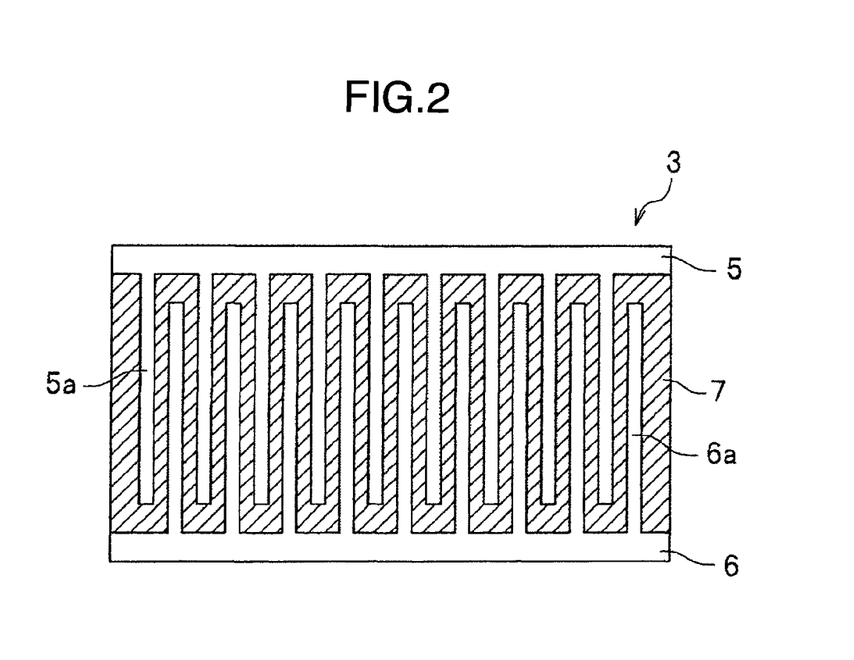
FIG. 2 is a diagram depicting a model of a structure of electrodes used in the inter-bus-bar built-in capacitor in accordance with the first embodiment of the present invention.

In addition, it is desirable to provide the upper and lower electrodes with internal electrodes having a comb-teeth structure. FIG. 2 is a diagram depicting a model of the structure of preferable electrodes used in the inter-bus-bar built-in capacitor 3 according to the first embodiment. As shown in FIG. 2, it is desirable that electrodes properly used in the inter-bus-bar built-in capacitor 3 according to the first embodiment are electrodes having an upper electrode 5 brought into contact with the upper bus bar (not shown in FIG. 2), an upper internal electrode 5a connected perpendicularly to the upper electrode 5, a lower electrode 6 brought into contact with the lower bus bar (not shown in FIG. 2) and a lower internal electrode 6a connected perpendicularly to the lower electrode 6. In addition, the high-dielectric-constant material 7 is provided between the upper electrode 5 and the lower electrode 6.

Figure 3:
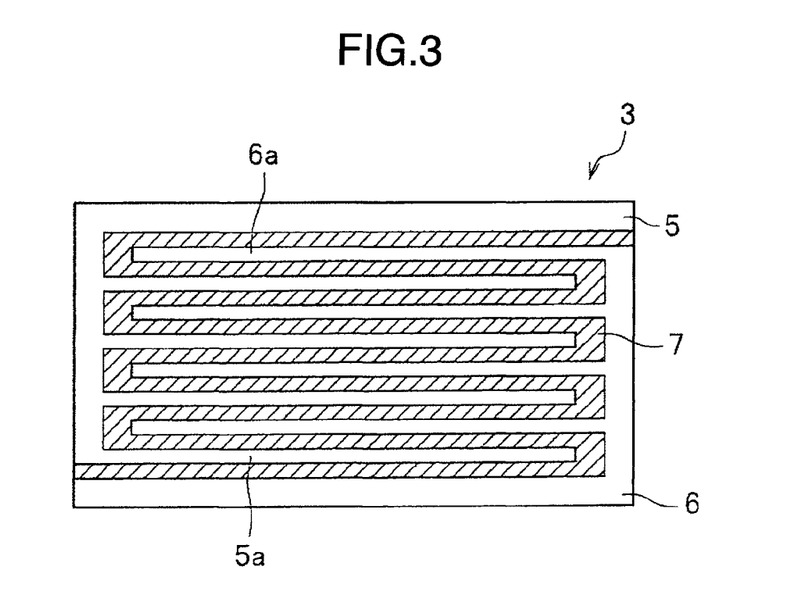
FIG. 3 is a diagram depicting a model of a typically modified structure of electrodes used in the inter-bus-bar built-in capacitor in accordance with the first embodiment of the present invention.

It is to be noted that the upper internal electrode 5a does not have to be provided perpendicularly to the upper electrode 5 whereas the lower internal electrode 6a does not have to be provided perpendicularly to the lower electrode 6. That is to say, the upper internal electrode 5a can also be provided all but perpendicularly to the upper electrode 5 whereas the lower internal electrode 6a can also be provided all but perpendicularly to the lower electrode 6. In addition, as shown in FIG. 3, the upper internal electrode 5a can also be provided in parallel to the upper electrode 5 whereas the lower internal electrode 6a can also be provided in parallel to the lower electrode 6. In this case, however, the upper internal electrode 5a does not have to be provided in parallel to the upper electrode 5 whereas the lower internal electrode 6a does not have to be provided in parallel to the lower electrode 6. That is to say, the upper internal electrode 5a can also be provided approximately in parallel to the upper electrode 5 whereas the lower internal electrode 6a can also be provided approximately in parallel to the lower electrode 6.

By providing the upper internal electrode 5a and the lower internal electrode 6a serving as internal electrodes as described above, the contact area between the internal electrodes and the high-dielectric-constant material 7 can be increased so that the electrical capacitance of the inter-bus-bar built-in capacitor 3 can be raised. As a result, a capacitor having a large size can be made smaller in number or can be downsized. Considering the fact that the length in the lateral direction (that is, a direction parallel to the contact surface between the bus bars and the upper electrode 5 and the lower electrode 6) is larger than the distance between the upper bus bar 1 and the lower bus bar 2, however, it is particularly desirable that the electrodes have a structure shown in FIG. 2 from a view point that the number of laminations can be increased.

Figure 4:
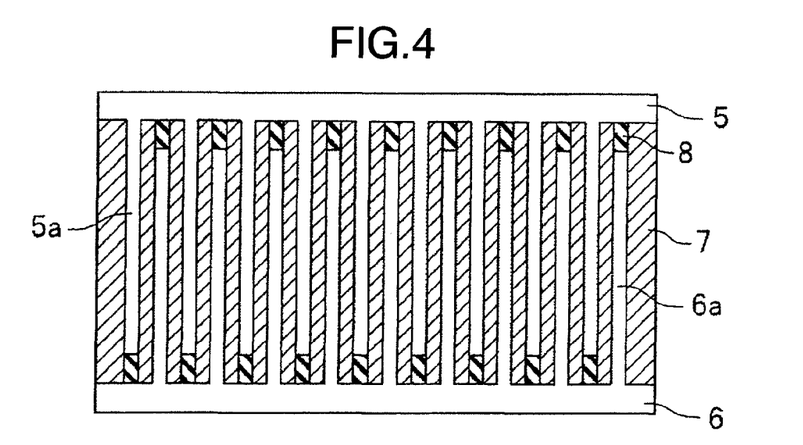
FIG. 4 is a diagram depicting a model of a typically modified structure of electrodes used in the inter-bus-bar built-in capacitor in accordance with the first embodiment of the present invention.

In addition, as shown in FIG. 4 for example, an insulation body 8 can be provided between the upper electrode 5 and the lower internal electrode 6a and between the lower electrode 6 and the upper internal electrode 5a. The insulation body 8 can be the same as the insulation body 4 to be described later or an insulation body having a type properly determined in accordance with a voltage applied to the upper bus bar 1 and the lower bus bar 2. An example of an insulation body having a properly determined type is a mixture obtained by blending barium titanate and manganese. By providing such an insulation body 8 between the upper electrode 5 and the lower internal electrode 6a and between the lower electrode 6 and the upper internal electrode 5a, it is possible to avoid short circuits between these electrodes, which approach each other, with a higher degree of certainty.

Entire Structure

As shown in FIG. 1, a plurality of inter-bus-bar built-in capacitors 3 according to the first embodiment are held between the upper bus bar 1 and the lower bus bar 2 and, in addition, adjacent inter-bus-bar built-in capacitors 3 are sealed against each other by making use of an insulation body 4. The insulation body 4 is not prescribed in particular. That is to say, the insulation body 4 can be any insulation body provided that the insulation resistance of the insulation body is high. A typical material of the insulation body 4 is resin having an insulation characteristic. To put it concretely, the resin can be epoxy resin, FRP (Fiber Reinforced Plastics), unsaturated polyester or bakelite, to mention a few. Any single resin material can be used alone. As an alternative, two or more resin materials having different types can be combined at an arbitrary combination ratio. In addition, by providing the insulation body 4 typically made of resin between inter-bus-bar built-in capacitors 3, surface discharge between the edges of the inter-bus-bar built-in capacitors 3 can be avoided.

Figure 5:
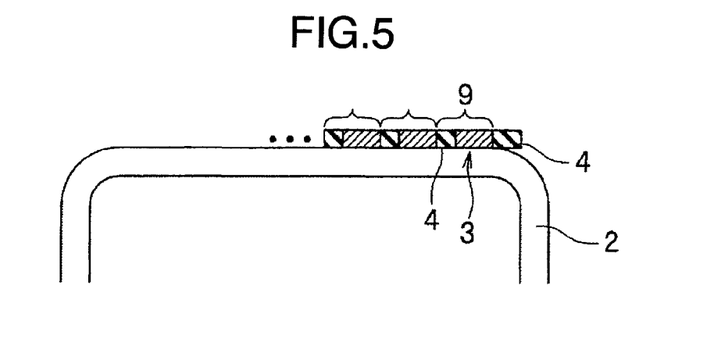
FIG. 5 is a diagram depicting a model of a typical method for installing the inter-bus-bar built-in capacitor in accordance with the first embodiment of the present invention.

On top of that, as shown in FIG. 5, for example, capacitor units 9 each composed of an inter-bus-bar built-in capacitor 3 and an insulation body 4 are created. Then, the capacitor units 9 are arranged on the lower bus bar 2. After a predetermined number of capacitor units 9 have been arranged on the lower bus bar 2, the upper bus bar 1 is brought into contact (or bonded) with the capacitor units 9 from a position above the capacitor units 9 in order to hold the inter-bus-bar built-in capacitors 3 sealed against each other by the insulation body 4 by sandwiching the inter-bus-bar built-in capacitors 3 between the upper bus bar 1 and the lower bus bar 2. In this way, a pair consisting of the upper bus bar 1 and the lower bus bar 2 which are opposing to each other can be made with ease. In addition, by adopting such a configuration, there are also provided merits that when an inter-bus-bar built-in capacitor 3 fails for example, only the failing inter-bus-bar built-in capacitor 3 can be replaced so that maintenance is easy to carry out and the replacement cost is low.

In addition, by providing a plurality of inter-bus-bar built-in capacitors as described above, no matter how long and how thick the bus bars are, the number of provided inter-bus-bar built-in capacitors can be determined properly. Thus, the generality property of the inter-bus-bar built-in capacitor can be enhanced and the enhanced generality leads to a reduced manufacturing cost of the inter-bus-bar built-in capacitor. Particularly, in the case of a bus bar which is long in the lateral direction, it may be difficult to install a single inter-bus-bar built-in capacitor (that is, a single high-dielectric-constant material). Even in such a case, in accordance with split inter-bus-bar built-in capacitors provided by the first embodiment, the bus bars and the inter-bus-bar built-in capacitors can be handled with ease so that the inter-bus-bar built-in capacitors can be installed easily.

As described before, however, the inter-bus-bar built-in capacitor 3 according to the first embodiment includes a high-dielectric-constant material which has a relative dielectric constant of at least 50 when a voltage of 1,000 V is applied to a pair of opposing bus bars at a temperature of 25° C. Thus, it is not always necessary to provide a plurality of inter-bus-bar built-in capacitors 3 between the bus bars forming the pair. That is to say, it is possible to provide a configuration in which only one inter-bus-bar built-in capacitor 3 is installed between the bus bars.

Figure 6:
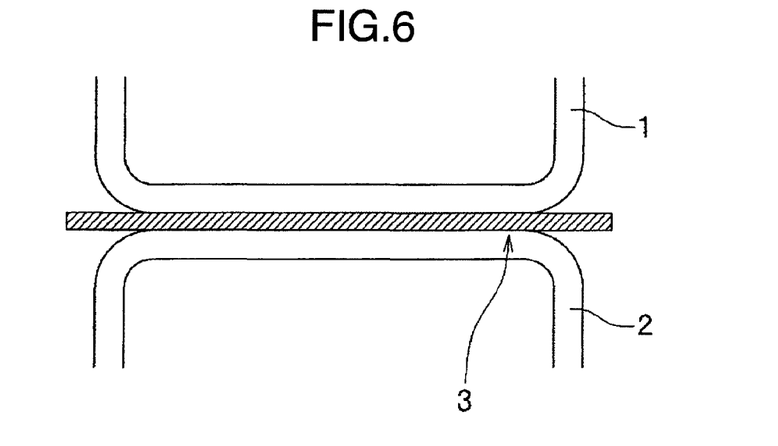
FIG. 6 is a diagram depicting a model of a typically modified inter-bus-bar built-in capacitor in accordance with the first embodiment of the present invention.

FIG. 6 is a diagram depicting a model of a typically modified capacitor built in between bus bars in accordance with the first embodiment. In the typical configuration shown in FIG. 6, a single inter-bus-bar built-in capacitor 3 is provided throughout the whole area of the upper bus bar 1 and the lower bus bar 2. In addition, the edges of the inter-bus-bar built-in capacitor 3 protrude out to the outer side more than the edges of the upper bus bar 1 and the lower bus bar 2 do. By providing such a layout, surface discharge on the edges of the upper bus bar 1 and the lower bus bar 2 can be avoided with a higher degree of certainty.

It is to be noted that, in the typical configuration shown in FIG. 6, the edge of the inter-bus-bar built-in capacitor 3 is the high-dielectric-constant material itself. However, it is also possible to provide a typical configuration in which an insulation body is provided on the edge of the inter-bus-bar built-in capacitor 3 and the insulation body protrudes out to the outer side more than the edges of the upper bus bar 1 and the lower bus bar 2 do.

In addition, in the typical configurations depicted in FIGS. 1 to 6, the upper bus bar 1 and the lower bus bar 2 each are shown to have a curved shape. However, the upper bus bar 1 and the lower bus bar 2 do not have to have a curved shape. For example, the upper bus bar 1 and the lower bus bar 2 can also have a flat-plate shape shown in FIG. 8 to be described later. Even in such a case, it is possible to obtain the same effects as the first embodiment.

2. Power Equipment and Power Converting Apparatus

Power equipment according to an embodiment is power equipment provided with a pair of opposing bus bars for supplying electric power. Between the bus bars, a high-dielectric-constant material is provided. The high-dielectric-constant material has a relative dielectric constant of at least 50 when a voltage of 1,000 V is applied thereto at a temperature of 25° C. The concrete configuration of the power equipment according to the embodiment is not prescribed in particular. However, the bus bars and the high-dielectric-constant material which are employed in the power equipment according to the embodiment are identical with those described in the previous chapter with a title of "1.

Inter-Bus-Bar Built-in Capacitor". Thus, the bus bars and the high-dielectric-constant material are not explained again in the following description.

On the other hand, a power converting apparatus according to an embodiment is provided with a switching device and a pair of opposing bus bars for supplying electric power to the switching device. Between the bus bars, a high-dielectric-constant material is provided. The high-dielectric-constant material has a relative dielectric constant of at least 50 when a voltage of 1,000 V is applied thereto at a temperature of 25° C.

Figure 7:
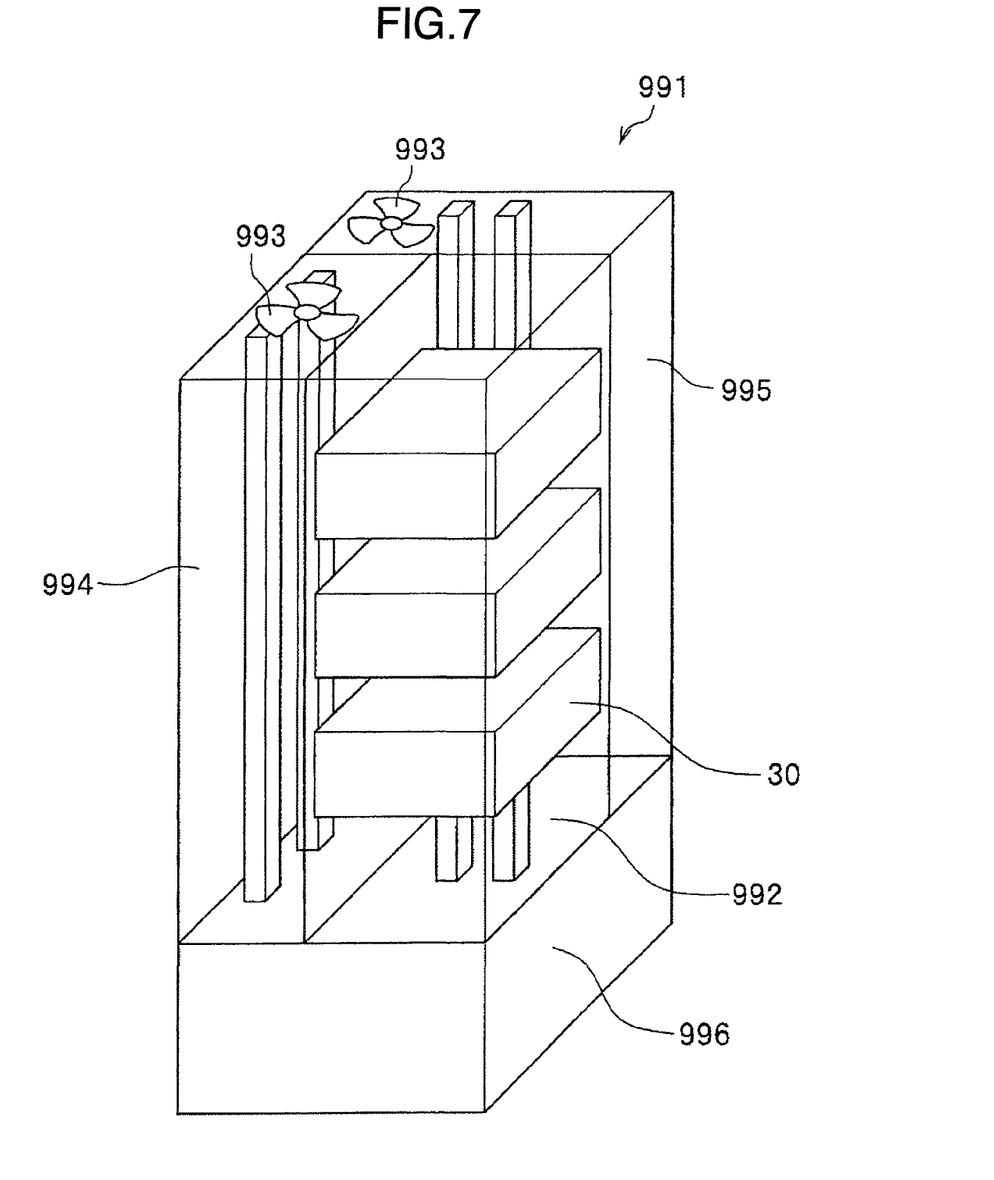
FIG. 7 is a diagram depicting a model of an internal structure of an inverter employing the inter-bus-bar built-in capacitor in accordance with the first embodiment of the present invention.

FIG. 7 is a diagram showing a representative internal structure of an inverter board 991 functioning as a concrete example of the power converting apparatus according to the embodiment. It is to be noted that the external wall of the inverter board 991 shown in FIG. 7 is usually a metallic wall which has a nontransparent characteristic. Thus, the internal structure cannot be observed from the outside. In order to make the explanation easy to give, however, FIG. 7 shows the internal structure which is deliberately made visible.

The inverter board 991 functioning as the power equipment shown in FIG. 7 is provided with an inverter unit 30 inside a unit chamber 992. The inverter unit 30 has the inter-bus-bar built-in capacitor according to the embodiment. In addition, the inverter board 991 is configured to also include at least a fan 993, a ventilation duct 994, a main circuit chamber 995 and a control section 996.

As described above, the inverter board 991 is usually configured as a metallic housing. A metal used for making a housing of the inverter board 991 is not prescribed in particular. However, the housing of the inverter board 991 can be made of typically stainless steel, iron or the like. It is to be noted that the housing of the inverter board 991 can be made of a single metal or can be made by arbitrarily combining two or more different metals.

The unit chamber 992 is provided to allow the inverter unit 30 to be inserted into and pulled from the unit chamber 992. In the configuration shown in FIG. 7, the number of the inverter units 30 accommodated in the unit chamber 992 is three. However, the number of the inverter units 30 accommodated in the unit chamber 992 does not have to be three.

In addition, in order to blow wind into the inverter unit 30, the unit chamber 992 is provided with an opening (not shown in the figure) linked to the ventilation duct 994 (to be described later). Air in the ventilation duct 994 is blown into the inverter unit 30 through this opening. In addition, direct-current bus bars, control lines and other components, which are not shown in the figure, are provided inside the unit chamber 992.

The fan 993 blows wind to the inverter unit 30 through the ventilation duct 994. In addition, the fan 993 blows wind also to the main circuit chamber 995 to be described later. The concrete configuration of the fan 993 is not prescribed in particular. In addition, the number of the fans 993 is two in the configuration shown in FIG. 3 but it does not have to be two. On top of that, the installation locations of the fans 993 are not prescribed in particular. For example, instead of installing a fan 993 for every inverter unit 30, a fan 993 can be placed at one location above the inverter board 991 so that it is possible to make the apparatus simpler and reduce the space. In addition, such a configuration gives a merit that, if a fan is broken, the broken fan can be replaced with ease.

The ventilation duct 994 blows air taken in by the fan 993 to the inverter units 30. In addition, the main circuit chamber 995 and the control section 996 are provided with a variety of power supplies, a variety of control lines and other components, which are not shown in the figure. The power supplies, the control lines and the other components drive the inverter units 30.

Figure 8:
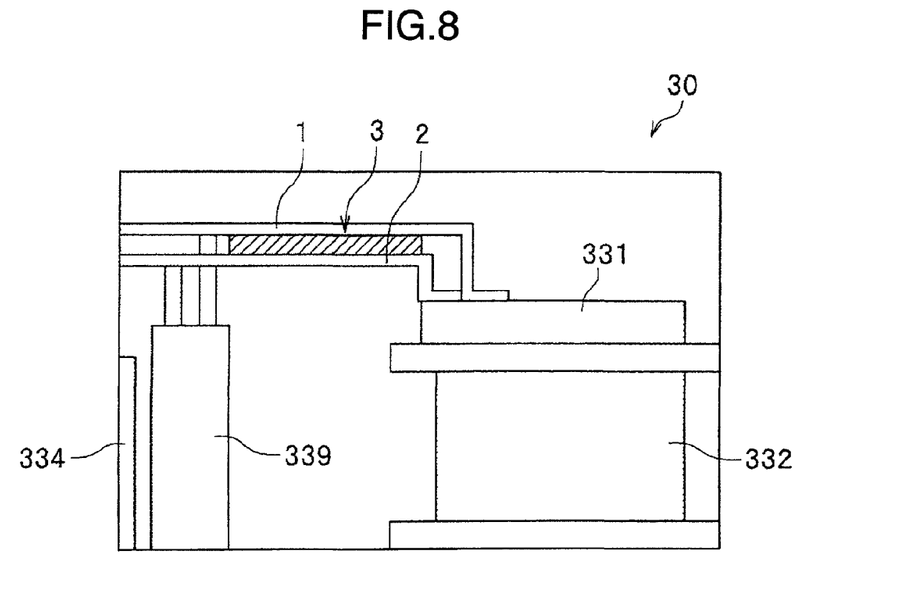
FIG. 8 is a diagram depicting a model of an internal structure of an inverter unit employed in the inverter shown in FIG. 7.

Next, the inverter unit 30 is explained by referring to FIG. 8 as follows. FIG. 8 is a diagram depicting a model of the internal structure of the inverter unit 30 employed in the inverter board 991 shown in FIG. 7. In the same way as FIG. 7, in order to make the explanation easy to provide, FIG. 8 also shows the internal structure which is deliberately made visible.

The inverter unit 30 shown in FIG. 8 is provided with an upper bus bar 1, a lower bus bar 2, an IGBT 331, a fan 332, an air filter 334 and a smoothing capacitor 339. The upper bus bar 1 and the fan 32 form a pair of opposing bus bars for holding an inter-bus-bar built-in capacitor 3 according to the embodiment by sandwiching the inter-bus-bar built-in capacitor 3 between the upper bus bar 1 and the lower bus bar 2. The inter-bus-bar built-in capacitor 3 includes a high-dielectric-constant material having a relative dielectric constant of at least 50 when a voltage of 1,000 V is applied thereto at a temperature of 25° C. The IGBT 331 is connected to the upper bus bar 1 and the lower bus bar 2 whereas the fan 332 is provided below the IGBT. The smoothing capacitor 339 is also connected to the upper bus bar 1 and the lower bus bar 2.

The bus bars composed of the upper bus bar 1 and the lower bus bar 2 are made of a metal exhibiting a conductive characteristic. The upper bus bar 1 and the lower bus bar 2 serve as a power supplying path for supplying electric power to the IGBT 331 to be described later from a power-supply source of typically the control section 996 employed in the inverter board 991.

The IGBT 331 is a semiconductor switching device receiving electric power supplied thereto through the bus bars. The IGBT 331 can typically be any arbitrary IGBT which is commonly known. The fan 332 provided below the IGBT 331 to serve as cooling fins is a fan for dissipating heat generated by the IGBT 331.

The air filter 334 passes air blowing through the ventilation duct 994 when the air is flowing to the inside of the inverter unit 30. The air filter 334 is capable of removing dusts or the like from the air flowing to the inside of the inverter unit 30.

Between the power-supply source of typically the control section 996 and the IGBT 331, the smoothing capacitor 339 connected to the bus bars is provided. The smoothing capacitor 339 accumulates electric charge used for switching the IGBT 331. The smoothing capacitor 339 is typically an aluminum electrolytic capacitor or a film capacitor. The smoothing capacitor 339 is a commonly known smoothing capacitor. In addition, the smoothing capacitor 339 can have any arbitrary shape. For example, the smoothing capacitor 339 has a box or cylindrical shape.

3. Conclusions

In accordance with the inter-bus-bar built-in capacitor provided by the embodiment, it is possible to reduce the number of large-size capacitors used in a power converting apparatus such as a high-voltage inverter and/or power equipment and/or make the capacitors smaller in size. That is to say, since the power converting apparatus and/or the power equipment according to the embodiment include the inter-bus-bar built-in capacitor, it is possible to reduce the number of large-size capacitors such as smoothing capacitors and/or make the large-size capacitors smaller in size without decreasing the amount of electric charge accumulated in the whole power converting apparatus and/or the whole power equipment. As a result, it is possible to reduce the sizes of the whole power converting apparatus and/or the whole power equipment.

Embodiments have been described so far, but implementations of the present invention are by no means limited to the embodiments. It is obvious that, for a person skilled in the art, the embodiments can be changed or revised in a variety of ways within the ranges of essentials and appended claims.

DESCRIPTION OF REFERENCE SYMBOLS

1 Upper bus bar
2 Lower bus bar
3 Inter-bus-bar built-in capacitor
4 Insulation body
5 Upper electrode
5a Upper internal electrode (internal electrode)
6 Lower electrode
6a Lower internal electrode (internal electrode)
7 High-dielectric-constant material
8 Insulation body
30 Inverter unit
331 IGBT
332 Cooling fins
334 Air filter
339 Smoothing capacitor
991 Inverter board (inverter)
992 Unit chamber
993 Fan
994 Ventilation duct
995 Main circuit chamber
996 Control section

The invention claimed is:

1. An inter-bus-bar built-in capacitor provided between a pair of opposing bas bars, comprising:
    a high-dielectric-constant material which has a relative dielectric constant of at least 50 when a voltage of 1,000 V is applied at a temperature of 25° C.;
    a first electrode arranged between the pair of opposing bus bars, the first electrode having a comb-teeth structure and being electrically connected to one of the opposing bus bars;
    a second electrode arranged between the pair of opposing bus bars, the second electrode having a comb-teeth structure and being electrically connected to the other one of the opposing bus bars; and
    an internal electrode arranged between the first electrode and the second electrode and having the high-dielectric-constant material,
    wherein the comb-teeth structure of the first electrode and the comb-teeth structure of the second electrode are arranged alternately so as to mesh with each other.

2. The inter-bus-bar built-in capacitor according to claim 1, wherein the high-dielectric-constant material is barium titanate and/or zinc oxide supplementation silicon carbide.

3. The inter-bus-bar built-in capacitor according to claim 2, wherein the internal electrode having a comb-teeth structure is parallel, approximately parallel, perpendicular or approximately perpendicular to a specific one of the opposing bus bars.

4. The inter-bus-bar built-in capacitor according to claim 2, wherein an insulation body is provided between an edge of the internal electrode having a comb-teeth structure and another one of the opposing bus bars.

5. The inter-bus-bar built-in capacitor according to claim 1, wherein an edge of the inter-bus-bar built-in capacitor or an insulation-body edge provided at a position more outer than the edge is provided at a location on the outer side of edges of the bus bars.

6. The inter-bus-bar built-in capacitor according to claim 1, wherein a plurality of the inter-bus-bar built-in capacitors are provided between the opposing bus bars.

7. The inter-bus-bar built-in capacitor according to claim 6, wherein an insulation body is provided between any adjacent ones of the inter-bus-bar built-in capacitors.

8. Power equipment, comprising:
    a pair of opposing bus bars for supplying electric power,
    a high-dielectric-constant material being provided between the bus bars having a relative dielectric constant of at least 50 when a voltage of 1,000 V is applied at a temperature of 25° C.;
    the power equipment comprising:
    a first electrode arranged between the pair of opposing bus bars, the first electrode having a comb-teeth structure and being electrically connected to one of the opposing bus bars;
    a second electrode arranged between the pair of opposing bus bars, the second electrode having a comb-teeth structure and being electrically connected to the other one of the opposing bus bars; and
    an internal electrode arranged between the first electrode and the second electrode and having the high-dielectric-constant material,
    wherein the comb-teeth structure of the first electrode and the comb-teeth structure of the second electrode are arranged alternately so as to mesh with each other.

9. A power converting apparatus, comprising:
    a switching device; and
    a pair of opposing bus bars for supplying electric power to the switching device,
    a high-dielectric-constant material being provided between the bus bars having a relative dielectric constant of at least 50 when a voltage of 1,000 V is applied at a temperature of 25° C.;
    the converting apparatus comprising:
    a first electrode arranged between the pair of opposing bus bars, the first electrode having a comb-teeth structure and being electrically connected to one of the opposing bus bars;
    a second electrode arranged between the pair of opposing bus bars, the second electrode having a comb-teeth structure and being electrically connected to the other one of the opposing bus bars; and
    an internal electrode arranged between the first electrode and the second electrode and having the high-electric-constant material,
    wherein the comb-teeth structure of the first electrode and the comb-teeth structure of the second electrode are arranged alternately so as to mesh with each other.

* * * * *